United States Patent
Maruyama et al.

(10) Patent No.: US 7,240,432 B2
(45) Date of Patent: Jul. 10, 2007

(54) METHOD OF MANUFACTURING A SEMICONDUCTOR DEVICE TESTING CONTACTOR HAVING A CIRCUIT-SIDE CONTACT PIECE AND TEST-BOARD-SIDE CONTACT PIECE

(75) Inventors: Shigeyuki Maruyama, Kawasaki (JP); Hirohisa Matsuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 84 days.

(21) Appl. No.: 11/147,167

(22) Filed: Jun. 8, 2005

(65) Prior Publication Data

US 2005/0225342 A1 Oct. 13, 2005

Related U.S. Application Data

(62) Division of application No. 09/739,288, filed on Dec. 19, 2000, now Pat. No. 6,939,142.

(30) Foreign Application Priority Data

Mar. 22, 2000 (JP) ............................. 2000-080974

(51) Int. Cl.
*H01R 43/01* (2006.01)

(52) U.S. Cl. ............................. 29/882; 29/876; 29/881; 29/844

(58) Field of Classification Search .................. 29/881, 29/882, 876, 884, 846, 842, 844, 838, 593; 439/66, 80–83, 591, 68–71, 74

See application file for complete search history.

(56) References Cited

U.S. PATENT DOCUMENTS

| | | | | |
|---|---|---|---|---|
| 4,548,451 A | * | 10/1985 | Benarr et al. | 439/66 X |
| 5,139,427 A | | 8/1992 | Boyd et al. | 439/66 |
| 5,228,861 A | | 7/1993 | Grabbe | 439/66 |
| 5,759,047 A | * | 6/1998 | Brodsky et al. | 439/66 |
| 5,812,378 A | | 9/1998 | Fjelstad et al. | 361/769 |
| 5,848,685 A | | 12/1998 | Smith et al. | 200/275 |
| 5,926,951 A | | 7/1999 | Khandros et al. | 29/843 |
| 5,994,152 A | | 11/1999 | Khandros et al. | 436/617 |
| 6,029,344 A | | 2/2000 | Khandros et al. | 29/874 |
| 6,179,624 B1 | | 1/2001 | McHugh et al. | 439/71 |

FOREIGN PATENT DOCUMENTS

JP           4-83355      *    3/1992    ................... 29/876

* cited by examiner

*Primary Examiner*—A. Dexter Tugbang
(74) *Attorney, Agent, or Firm*—Armstrong, Kratz, Quintos, Hanson & Brooks, LLP

(57) ABSTRACT

A contactor is placed between a semiconductor device and a test board. A contact electrode of the contactor electrically connects the semiconductor device to the test board. The contact electrode is formed of a conductive layer provided on an insulating substrate. The contact electrode comprises a first contact piece which contacts a terminal of the semiconductor device, a second contact piece which contacts an electrode of the test board, and a connecting portion which electrically connects the first contact piece and the second contact piece.

9 Claims, 17 Drawing Sheets

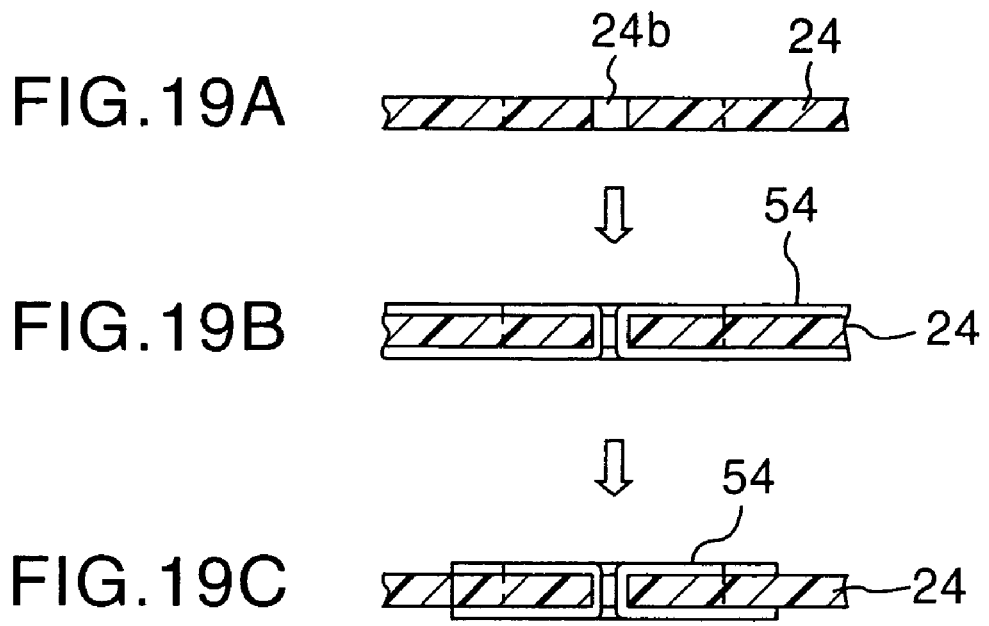
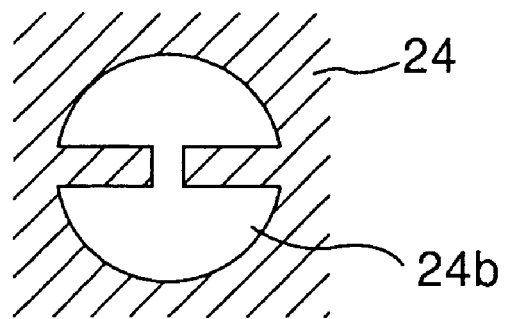

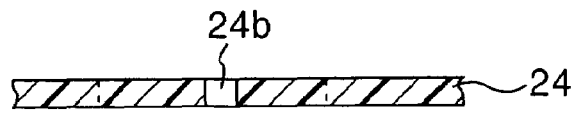
FIG. 21A
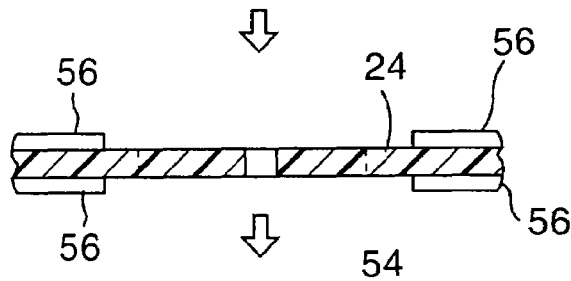
FIG. 21B
FIG. 21C
FIG. 21D
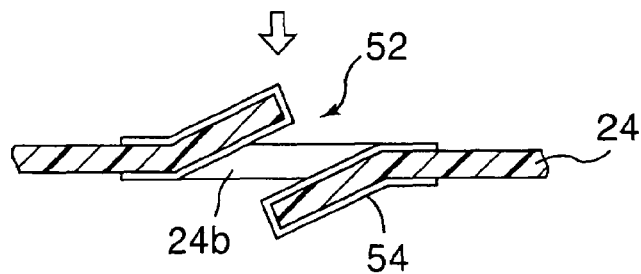
FIG. 22
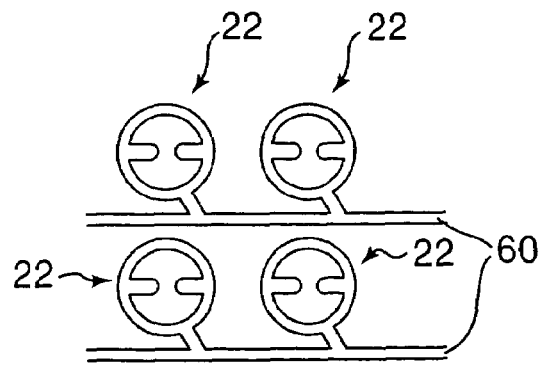

METHOD OF MANUFACTURING A SEMICONDUCTOR DEVICE TESTING CONTACTOR HAVING A CIRCUIT-SIDE CONTACT PIECE AND TEST-BOARD-SIDE CONTACT PIECE

CROSS REFERENCE TO RELATED APPLICATION

This application is a division of Ser. No. 09/739,288, filed Dec. 19, 2000, now U.S. Pat. No. 6,939,142, which is based on Japanese Application No. 2000-080974 filed Mar. 22, 2000.

BACKGROUND OF THE INVENTION

1. Field of the Invention

The present invention generally relates to a method of manufacturing a contactor for testing a semiconductor device and, more particularly, to a method of manufacturing a contactor for testing an LSI (Large Scale Integration) circuit having fine terminals or terminals arranged with a fine pitch and a manufacturing method of the contactor.

In testing a semiconductor device such as an LSI circuit during a manufacturing process thereof, a contactor is used for making electrical contact with a terminal of the LSI circuit. In testing a conventional semiconductor device having a socket for connection, the socket can be used as a contactor. However, an LSI circuit, such as a so-called KGD (Known Good Die), which is to be tested as a bare chip not yet packaged, or a CSP (Chip Size Package), does not have a socket. Therefore, a contactor for test use needs to be prepared for such an LSI circuit.

Recently, a wafer-level packaging technology has been developed, which technology allows for packaging a semiconductor chip in the form of a wafer. This calls for testing of a plurality of semiconductor devices in the form of a wafer. Therefore, it is desired that a low-cost testing contactor be developed, which contactor can be easily manufactured and is usable for such testing.

2. Description of the Related Art

Tests using contactors include a burn-in test and such a final test as a high-speed test.

Because a burn-in test requires a long period of time for its process, in a wafer-level testing, all of LSI circuits on a wafer need to be tested at one time. To realize this, terminals of all of the LSI circuits wafer to be put into contact with probes, and wires connected to the probes need to be drawn out to the exterior by a test board (burn-in board). Such a burn-in board has to have tens of thousands of terminals.

Because the burn-in test puts an LSI circuit under a high-temperature condition (ranging from 125° C. to 150° C.), a testing contactor has to have high heat resistivity. It has conventionally been very difficult to realize a contactor which fulfills these requirements, and if the contactor could be realized, the contactor would be extraordinarily costly and have a short life duration.

To conduct a high-speed test in the form of a wafer as a final test, a length of a probe of a contactor has to be smaller. That is, because the length of the probe is substantially proportional to the impedance of the contactor, the high-speed test cannot be performed with the increased impedance of a contactor having a long probe. Therefore, the probe of a contactor used in the high-speed test has to be as short as possible.

As in the burn-in test, in order to test a plurality of semiconductor devices at one time, a multitude of probes have to be arranged close to one another. It has conventionally been very difficult to realize a contactor which fulfills these requirements, and if it could be realized, the contactor would be extraordinarily costly.

FIG. 1 is a cross-sectional view of a part of a conventional contactor using an anisotropic conductive elastomer. The contactor shown in FIG. 1 uses an anisotropic conductive rubber 2 as an anisotropic conductive elastomer. The anisotropic conductive rubber 2 is disposed between an LSI circuit 6, a testee, and a test board 8. The test board 8 has electrodes 8a to be electrically connected to terminals 6a of the LSI circuit 6.

A membrane 4 is disposed between the anisotropic conductive rubber 2 and the LSI circuit 6 in order to ensure contacts between the anisotropic conductive rubber 2 and the terminals 6a of the LSI circuit 6. Therefore, the membrane 4 is unnecessary if the contacts can be ensured without it. In addition, although FIG. 1 shows the terminals 6a of the LSI circuit 6 formed on concave portions, the terminals 6a do not necessarily have to be formed on the concave portions, but may be formed on a flat surface.

The anisotropic conductive rubber 2 is arranged to have conductive portions 2b and other insulating portions. Accordingly, each of the terminals 6a of the LSI circuit 6 is electrically connected to the corresponding electrode 8a. In this structure, an elasticity of the anisotropic conductive rubber 2 ensures a contact pressure between each of the terminals 6a of the LSI circuit 6 and the corresponding electrode 8a of the test board 8.

The above-mentioned contactor using an anisotropic conductive rubber has a simple structure and is often used in conventional wafer-level testing. The anisotropic conductive rubber has an advantage of having a small inductance. Also, the anisotropic conductive rubber, when deteriorated or damaged, can be replaced, independent of a test board.

Aside from the above-mentioned contactor using an anisotropic conductive material, there is a contactor using a spring-type contact pin. FIG. 2 is a side view of a part of a conventional contactor using a spring pin.

The contactor shown in FIG. 2 has bent wires 10 as probes (contact pins) on a test board 12. Such a bonding wire as a gold wire is used as the wire 10. The wire 10 is formed by a wire bonder. Specifically, the wire 10 is severed after one end of the wire 10 is bonded to an electrode 12a of the test board 12 and is bent as shown in FIG. 2. The bent parts enable the wire 10 to deform elastically in a direction perpendicular to a plane of the test board 12. Pressing the other end of the wire 10 against the terminal 6a of the LSI circuit 6 and utilizing the elastic deformation of the wire 10 secures a sure contact of the wire 10 to the terminal 6a.

In the above-mentioned contactor using a spring pin, the wide range of the elastic deformation, from 100 µm to 300 µm, of the wire 10 (probe) secures a sufficient contact pressure. Additionally, in case heights of a multitude of the wires 10 vary to some degree, a sure contact is secured between each of the wires 10 and the corresponding terminal 6a. Also, a durability of the wire 10 is so superior to that of the anisotropic conductive rubber that the wire 10 can be used repeatedly one hundred thousand times approximately. Further, the wire 10 will not be deteriorated if put under a high-temperature condition as in a burn-in test.

As another example of a conventional contactor, there is a cantilever probing card. The cantilever probing card has a probe composed of such substances as tungsten. The probe is set oblique on a surface of a test board. The probe is of the size quite longer than the above-mentioned bent wire probe, providing flexibility to the probe under consideration. That is, the oblique arrangement and the flexibility of this probe give a sufficient elasticity so as to ensure a contact pressure.

The above-mentioned contactor using an anisotropic conductive material has the following problems to be solved: (1) a narrow range of an elastic deformation; and (2) a short durability.

(1) The Problem of a Narrow Range of an Elastic Deformation

A 200-μm-thick anisotropic conductive rubber has a narrow range of elastic deformation from approximately 25 μm to 100 μm. Therefore, if a terminal-containing surface of an LSI circuit is not flat enough, the narrow range of the elastic deformation cannot provide a sure contact. Thus, the LSI circuit has to have such a costly substrate as a ceramic substrate and a glass substrate having a flat enough surface. Additionally, with respect to such an LSI circuit as a wafer-level CSP using large solder balls, heights of the solder balls on a wafer vary by approximately 100 μm, with which variation the anisotropic conductive rubber cannot provide a sure contact.

(2) The Problem of a Short Durability

The anisotropic conductive rubber is extremely prone to deterioration in a high-temperature condition and, thus, cannot endure a repeated contact. Especially in a high-temperature condition (ranging from 125° C. to 150° C.) as in a burn-in test, a base rubber undergoes a plastic deformation and, thus, cannot endure repeated use. In response to this, the deteriorated anisotropic conductive rubber may be replaced, independent of a test board. However, an anisotropic conductive rubber usable for the size of wafer costs tens of thousands of yen per piece, raising a test cost for a wafer to be tested.

The above-mentioned contactor using a spring pin has the following problems to be solved: (1) an extremely high manufacturing cost; and (2) an irreplaceable contact pin.

(1) The Problem of an Extremely High Manufacturing Cost

A bent contact pin (probe) as shown in FIG. 2 is formed one by one by a wiring bonder. Therefore, in accordance with the number of probes to be formed, a manufacturing cost of a contactor increases. A wafer-level LSI circuit sometimes has as many as 50,000 terminals. In this case, a contactor has to have 50,000 probes correspondingly, extremely raising a manufacturing cost of the contactor. Additionally, a life cycle of a contactor is currently shortened to approximately 180 days, inevitably putting limits to repeated use of a contactor used in a lengthy burn-in test. For example, when a burn-in test requires 24 hours (a day) per wafer, a contactor can be used only 180 times approximately. Therefore, a depreciation expense of a contactor for a wafer becomes enormously high. Hence, such a contactor cannot practically be employed.

(2) The Problem of an Irreplaceable Contact Pin

When even only one of contact pins (probes) becomes damaged and unusable, the entire contactor also becomes unusable. As a matter of fact, in an LSI circuit test, it is difficult to completely keep a contact pin from being burned by a latch-up (overcurrent) in a burn-in test or from being damaged by a mechanical shock. However, since a contact pin is directly bonded to an electrode of a test board, it is difficult to remove a damaged pin from among other pins and re-form a new pin among the other pins. Therefore, a loss of only one pin may lead to spoiling an entire contactor and losing a huge sum financially.

Also, the cantilever probing card has a problem to be solved: a high impedance.

A contact pin of the cantilever probing card is ordinarily formed 20 mm to 30 mm in length in order to acquire a certain amount of elastic deformation. Generally, a pin of 20 to 30 mm in length has an impedance of 20 to 30 nH (nanohenries) and, thus, the entire probing card has large impedance. With the probe card having the large impedance, a high-speed test cannot be performed. For example, a device designed for an approximately 20 to 30 MHz operation can be tested with pins of 20 to 30 mm in length without a problem. However, a high-speed device designed to operate at more than 200 MHz cannot be tested at high speed because of the large impedance of the cantilever probing card.

SUMMARY OF THE INVENTION

It is a general object of the present invention to provide an improved and useful contactor for testing a semiconductor device in which contactor the above-mentioned problems are eliminated.

A more specific object of the present invention is to provide a contactor for testing a semiconductor device which contactor, for a wafer-level burn-in test: (1) is low-cost and can have a multitude of probes; (2) can be replaced independently of other contactors when a probe thereof is damaged; and (3) has high heat resistivity and a mechanical life duration of several hundreds of times, and which contactor, for a final test: (1) can undergo a high-speed test due to its short probe; and (2) can be replaced independently of other contactors when a probe thereof is damaged, and a manufacturing method of the contactor.

In order to achieve the above-mentioned objects, there is provided according to one aspect of the present invention a contactor which is placed between a semiconductor device and a test board so as to electrically connect the semiconductor device to the test board, the contactor comprising:

an insulating substrate; and a contact electrode formed of a conductive layer provided on the insulating layer, the contact electrode comprising a first contact piece which contacts a terminal of the semiconductor device, a second contact piece which contacts an electrode of the test board, and a connecting portion which electrically connects the first contact piece and the second contact piece.

According to the present invention, the contact electrode is formed of the conductive layer provided beforehand on the insulating layer, and contacts both the semiconductor device and the test board. Therefore, by using a conventional technology for manufacturing a semiconductor device, a multitude of the contact electrodes can be formed on the insulating substrate at one time. Additionally, since elasticity of the conductive layer provides a contact pressure for each of the contact pieces, a low-cost contact electrode having a simple structure can be formed. Further, the contact piece is not bonded to the test board but only contacts the electrode of the test board in testing. Therefore, when the contact electrode is damaged, only the contactor needs to be replaced. Further still, the contact piece, formed of the conductive layer, can provide a wide range of elastic deformation, and thus the length of the contact electrode can be smaller. This allows, in testing, the semiconductor device to perform at a high speed.

Additionally, in the present invention, the contactor may further comprise an opening in the insulating substrate at a position where the contact electrode is formed, one of the first contact piece and the second contact piece extending from one surface of the insulating substrate to the other surface thereof through the opening.

According to the present invention, since one of the first contact piece and the second contact piece extends through the opening from one surface of the insulating substrate to the other surface thereof, the contact electrode can have a simple structure but still allows the contact pieces to extend on both surfaces of the insulating layer.

Additionally, with the contactor according to the present invention, the first contact piece and the second contact piece may be placed away from each other, and the connecting portion electrically may connect the first contact piece and the second contact piece as an interconnection pattern having a predetermined shape.

According to the present invention, since the first contact piece and the second contact piece are formed as an interconnection pattern, the second contact piece can be formed at any position. This provides a large degree of freedom in arranging the second contact piece, and thus provides a large degree of freedom in arranging the electrode of the test board which the second contact piece contacts.

Additionally, with the contactor according to the present invention, each of the first contact piece and the second contact piece may be placed so that a longitudinal direction thereof is aligned with a radial direction from a center of the insulating substrate.

According to the present invention, the first contact piece and the second contact piece are placed so that the longitudinal directions thereof are aligned with a radial direction from the center of the insulating substrate. This prevents the tip of each of the contact pieces from being detached from the terminal of the semiconductor device or the electrode of the test board when the contactor, the semiconductor device and the test board undergo thermal expansion.

In order to achieve the above-mentioned objects, there is also provided according to another aspect of the present invention a method of manufacturing a contactor which contactor is placed between a semiconductor device and a test board so as to electrically connect the semiconductor device to the test board, the method comprising the steps of:
forming a conductive layer on an insulating substrate;
processing the conductive layer into a contact electrode comprising a first contact piece which contacts a terminal of the semiconductor device, a second contact piece which contacts an electrode of the test board, and a connecting portion which electrically connects the first contact piece and the second contact piece; and
bending the first contact piece toward a first surface of the insulating substrate at a predetermined angle and bending the second contact piece toward a second surface opposite to the first surface of the insulating substrate at a predetermined angle.

According to the present invention, the contact electrode is formed of the conductive layer provided beforehand on the insulating layer, and contacts both the semiconductor device and the test board. Therefore, by using a conventional technology for manufacturing a semiconductor device, a multitude of the contact electrodes can be formed on the insulating substrate at one time. Additionally, the contact pieces bent toward opposing sides and elasticity of the conductive layer provide a contact pressure for each of the contact pieces. Therefore a low-cost contact electrode having a simple structure can be formed. Further, the contact piece is not bonded to the test board but only contacts the electrode of the test board in testing. Therefore, when the contact electrode is damaged, only the contactor needs to be replaced. Further still, the contact piece, formed of the conductive layer, can provide a wide range of elastic deformation, and thus the length of the contact electrode can be smaller. This allows, in testing, the semiconductor device to perform at a high speed.

Additionally, in the method according to the present invention, the step of forming a conductive layer may include the step of applying a film material composed of a conductive material on a surface of the insulating substrate; and
the step of processing may include the step of removing parts of the conductive layer applied on the insulating substrate so as to form the first contact piece, the second contact piece and the connecting portion.

According to the present invention, the conductive layer is formed on the insulating substrate by applying a film material such as a copper plate or a copper foil. The conductive layer can be easily processed and formed into the contact electrode by such a method as etching.

Additionally, in the method according to the present invention, the step of forming a conductive layer may include the step of depositing a conductive material on a surface of the insulating substrate so as to form the conductive layer; and
the step of processing may include the step of removing parts of the conductive layer deposited on the insulating substrate so as to form the first contact piece, the second contact piece and the connecting portion.

According to the present invention, the conductive layer is formed on the insulating substrate by depositing a conductive material by such a method as sputtering or deposition. The conductive layer can be easily processed and formed into the contact electrode by such a method as etching.

Additionally, the method according to the present invention may further comprise the step of forming an opening in the insulating substrate at a position where each of the first contact piece and the second contact piece is formed.

According to the present invention, since the opening is formed in the insulating substrate at a position where the first contact piece and the second contact piece are formed, one of the first contact piece and the second contact piece can be bent thorough the opening to the opposite side. Additionally, a bending template can be used through the opening to bend each of the contact pieces. Therefore, a contact electrode can be easily formed.

In order to achieve the above-mentioned objects, there is also provided according to still another aspect of the present invention a method of manufacturing a contactor which contactor is placed between a semiconductor device and a test board so as to electrically connect the semiconductor device to the test board, the method comprising the steps of:
processing parts of an insulating substrate into a first contact piece which contacts a terminal of the semiconductor device and a second contact piece which contacts an electrode of the test board;
forming a conductive layer on the first contact piece and the second contact piece and forming a part of the conductive layer into a connecting portion which electrically connects the first contact piece and the second contact piece; and
bending the first contact piece toward a first surface of the insulating substrate at a predetermined angle and bending the second contact piece toward a second surface opposite to the first surface of the insulating substrate at a predetermined angle.

According to the present invention, after forming the contact pieces on the insulating substrate, the conductive layer is formed on the contact pieces to form the contact electrode. Therefore, by using a conventional technology for manufacturing a semiconductor device, a multitude of the contact electrodes can be formed on the insulating substrate at one time. Additionally, the contact pieces bent toward opposing sides and elasticity of the conductive layer provide a contact pressure for each of the contact pieces. Therefore a low-cost contact electrode having a simple structure can be formed. Further, the contact piece is not bonded to the test board but only contacts the electrode of the test board in testing. Therefore, when the contact electrode is damaged, only the contactor needs to be replaced. Further still, the contact piece, formed of the conductive layer, can provide a wide range of elastic deformation, and thus the length of the contact electrode can be smaller. This allows, in testing, the semiconductor device to act at a high speed.

Additionally, in the method according to the present invention, the step of processing may include the step of forming an opening in the insulating substrate so as to form the first contact piece and the second contact piece. According to the present invention, since a shape of each of the first contact piece and the second contact piece is formed by forming the opening in the insulating substrate, the contact piece can be easily formed.

Additionally, in the method according to the present invention, at least one of the first contact piece and the second contact piece may be one of a curved plane and a bent plane, and the method may further comprise the step of bending the at least one of the first contact piece and the second contact piece, at a position where the connecting portion and the at least one of the first contact piece and the second contact piece meet, at a predetermined angle from the insulating substrate.

According to the present invention, since the contact piece has a curved or bent plane, the curved or bent shape achieves a wide range of elastic deformation.

Additionally, the method according to the present invention may further comprise the step of forming at least one surface layer on a surface of the conductive layer so as to change properties of the contact electrode.

According to the present invention, forming the surface layer on the surface of the conductive layer can change properties, such as elasticity and electric properties, of the contact electrode.

Additionally, the method according to the present invention may further comprising the step of forming a reinforcing material at a position where the connecting portion and each of the first contact piece and the second contact piece meet.

According to the present invention, the reinforcing material can be formed at a position where the connecting portion and each of the first contact piece and the second contact piece connect. That is, only the part which suffers the largest stress in each of the contact pieces is reinforced. This prevents the contact piece from undergoing permanent deformation or being damaged.

Other objects, features and advantages of the present invention will become more apparent from the following detailed description when read in conjunction with the accompanying drawings.

BRIEF DESCRIPTION OF THE DRAWINGS

FIGS. 19A, 19B, and 19C illustrate steps of forming the contact electrode shown in FIG. 18;

FIG. 20 is a plan view of an opening formed in an insulating substrate;

FIGS. 21A-21D illustrate steps of forming the contact electrode shown in FIG. 18;

FIG. 22 is an illustration for explaining a contactor according to a fifth embodiment of the present invention;

DETAILED DESCRIPTION OF THE PREFERRED EMBODIMENTS

A description will now be given, with reference to the drawings, of first to twelfth embodiments according to the present invention.

Figure 1:
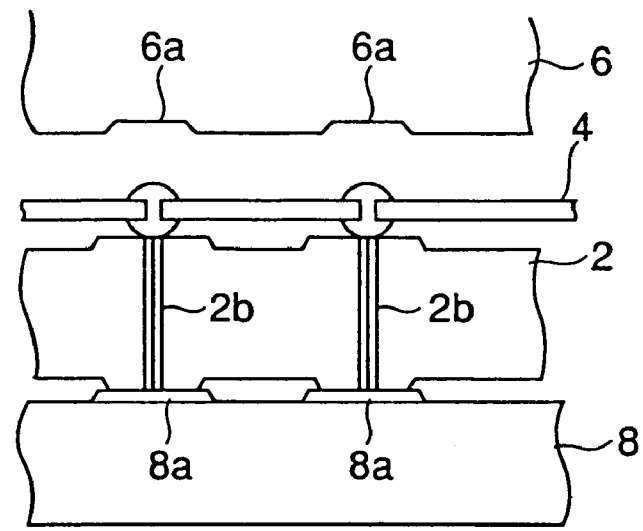
FIG. 1 is a cross-sectional view of a part of a conventional contactor using an anisotropic conductive elastomer.
Figure 2:
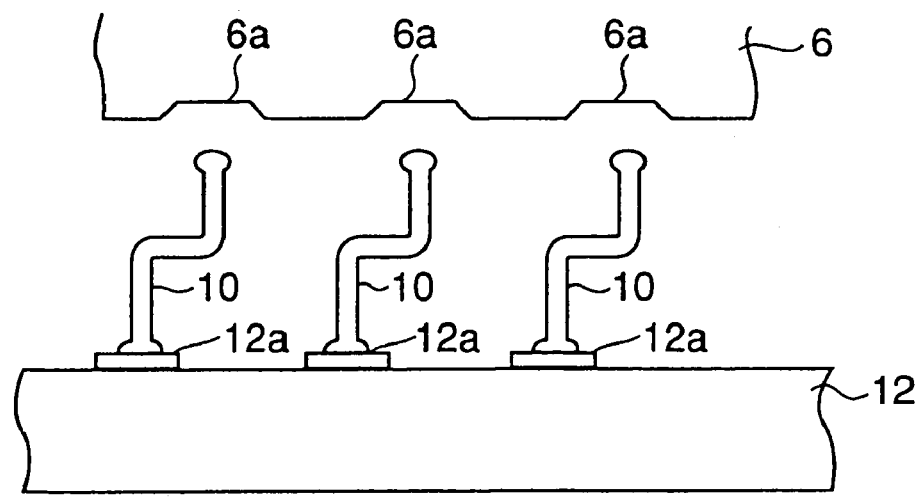
FIG. 2 is a side view of a part of a conventional contactor using a spring pin.
Figure 3:
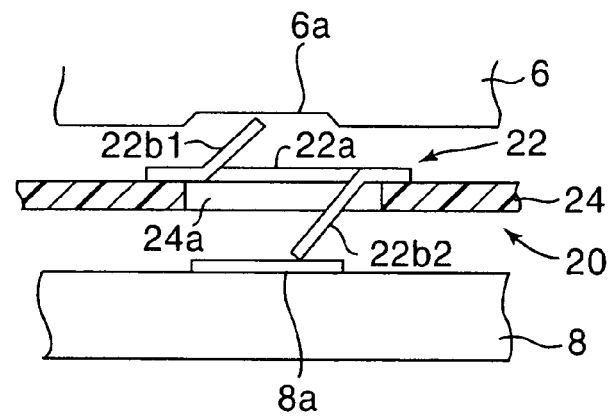
FIG. 3 is a cross-sectional view of a part of a contactor according to a first embodiment of the present invention.
Figure 4:
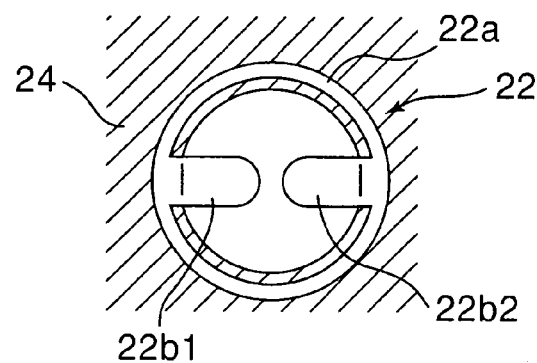
FIG. 4 is a plan view of a contact electrode shown in FIG. 3.

FIG. 3 is a cross-sectional view of a part of a contactor according to the first embodiment of the present invention. FIG. 4 is a plan view of a contact electrode shown in FIG. 3. A contactor 20 according to the first embodiment of the present invention is formed as a substrate, in the form of a board or sheet, comprising a plurality of contact electrodes 22 shown in FIG. 3 and FIG. 4.

As shown in FIG. 3, in testing an LSI circuit 6, the contactor 20 is placed between and electrically connects the LSI circuit 6 and a test board 8. The LSI circuit 6 has a plurality of terminals 6a formed as flat aluminum pads. The test board 8 has a plurality of electrodes 8a disposed at positions corresponding to the terminals 6a of the LSI circuit 6. The electrodes 8a are formed as flat pads each provided with a gold layer on its surface.

Each of the contact electrodes 22 is placed between a corresponding terminal 6a of the LSI circuit 6 and a corresponding electrode 8a of the test board 8. The contact electrode 22 is arranged to contact and electrically connect the terminal 6a and the electrode 8a. In the present embodiment, the contact electrode 22 is formed of a copper plate or a copper foil (Cu) on an insulating substrate 24.

The contact electrode 22, as shown in FIG. 4, has an annular portion 22a, an LSI-circuit-side contact piece 22b1 and a test-board-side contact piece 22b2. The insulating substrate 24 has a circular opening 24a having a diameter substantially equal to an inside diameter of the annular portion 22a.

The LSI-circuit-side contact piece 22b1 extends from an inner circumference of the annular portion 22a toward a center of the annular portion 22a, and is bent upwards at a predetermined angle near a part where the LSI-circuit-side contact piece 22b1 is connected to the annular portion 22a.

The test-board-side contact piece 22b2 extends from the inner circumference of the annular portion 22a toward the center of the annular portion 22a, and is bent downwards at a predetermined angle near a part where the test-board-side contact piece 22b2 is connected to the annular portion 22a. That is, the test-board-side contact piece 22b2 is bent toward an opposite side to the LSI-circuit-side contact piece 22b1 through the opening 24a formed in the insulating substrate 24.

Figure 5:
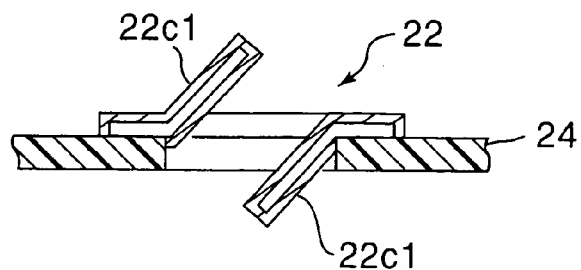
FIG. 5 is a cross-sectional view of the contact electrode shown in FIG. 3.

The LSI-circuit-side contact piece 22b1 and the test-board-side contact piece 22b2 may be formed of a copper plate or a copper foil and used as they are. However, if a surface thereof is formed of copper, the surface may become oxidized and thus may cause a poor connection. Also, a simple copper plate or copper foil may not be able to provide a necessary contact pressure (approximately 10 grams per pin). Thus, it is preferred that, as shown in FIG. 5, a conductive thin film layer 22c1 be formed on a surface of the contact electrode 22 in order to prevent the surface from oxidization, to increase a strength of the contact electrode 22 and improve an elasticity thereof.

The thin film layer 22c1 may be formed by plating. In this case, as a material forming the thin film layer 22c1, such a metal substance as nickel (Ni), cobalt (Co) and iron (Fe) is preferred, among which nickel (Ni) is especially preferred. An alloy comprising nickel (Ni), cobalt (Co), iron (Fe) or copper (Cu) may form the thin film layer 22c1. Also, gold (Au), silver (Ag), rhodium (Rh), palladium (Pd), platinum (Pt) and an alloy thereof may be used as the material. Further, tungsten (W), molybdenum (Mo) and an alloy thereof may also be used. Still further, an alloy of beryllium (Be) and copper (Cu) may form the thin film layer 22c1.

A description will now be given, with reference to FIGS. 6A, 6B and 6C, of a forming method of the contact electrode 22.

Figure 6A:
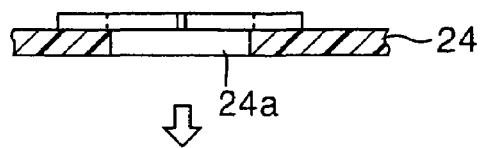
FIGS. 6A, 6B, and 6C illustrate steps of forming the contact electrode shown in FIG. 5.
Figure 6B:
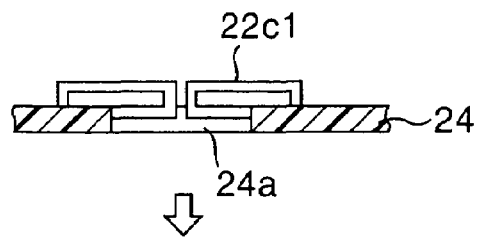
Figure 6C:
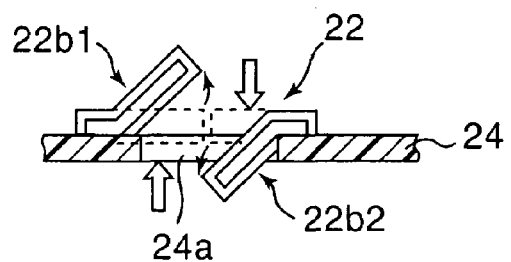

FIGS. 6A, 6B and 6C are an illustration of steps of forming the contact electrode 22. First, a copper plate or a copper foil is applied to the insulating substrate 24 having the opening 24a, and a prototype of the contact electrode 22 as shown in FIG. 6A is formed by such a method as etching. The opening 24a can be formed by laser machining, press working or etching. In addition, the opening 24a may be formed by etching after applying a copper plate or a copper foil to the insulating substrate 24. Additionally, in place of applying a copper plate or a copper foil, the prototype of the contact electrode 22 may be formed in such a manner as plating with a copper layer or depositing a copper layer.

Next, the prototype of the contact electrode 22 shown in FIG. 6A is plated so that the thin film layer 22c1 is formed thereon, as shown in FIG. 6B. A thickness of the thin film layer 22c1 may be determined by such considerations as a durability required for the contactor 20, an operating temperature and materials forming the terminal 6a of the LSI circuit 6.

Figure 7:
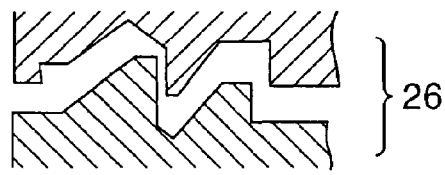
FIG. 7 is a cross-sectional view of a bending template used in a bending process of the contact electrode.

After completion of the plating process, a bending process of the contact pieces 22b1 and 22b2 is conducted, as shown in FIG. 6C. By using a bending template 26 comprising an upper template 26A and a lower template 26B as shown in FIG. 7, both of the contact pieces 22b1 and 22b2 can be bent in opposing directions at one time. Bending angles of the contact pieces 22b1 and 22b2 may be determined so that tips of the contact pieces 22b1 and 22b2 are located at predetermined positions (basically, substantially at the center) of the corresponding terminal 6a of the LSI circuit 6 and the corresponding electrode 8a of the test board 8, respectively, with considerations such as spring back taken into account.

In a case of manufacturing a testing contactor for a wafer-level LSI circuit, it is preferred that the bending process be performed for all of contactor electrodes at one time. However, since only a very short period of time is required for a bending process, the bending process may be performed group by group of several LSI circuits on a wafer.

When the thin film layer 22c1 is formed on the contact pieces, it is sometimes hard to provide sharp bending angles. In this case, the plating process of the thin film layer 22c1 may be performed after the bending process. In the plating process, it may matter that the bending angle and a shape of the contact pieces are altered. In this case, the bending process may be performed after plating of a certain thickness of the thin film layer 22c1, followed by a further plating process. Also, nickel (Ni) plating may be performed before the bending process in order to increase a mechanical strength of the contact pieces, and after the bending process, plating of gold (Au) or palladium (Pd), which is not prone to oxidization, may be performed.

The contactor 20 manufactured as mentioned above requires substantially the same manufacturing process and manufacturing cost, even when a multitude of contact electrodes (contact pins) have to be formed as in a case of testing a wafer-level LSI circuit. Therefore, the more contact pins there are, the lower a unit price for a contact pin becomes, and a low-cost contactor can be provided.

Figure 8:
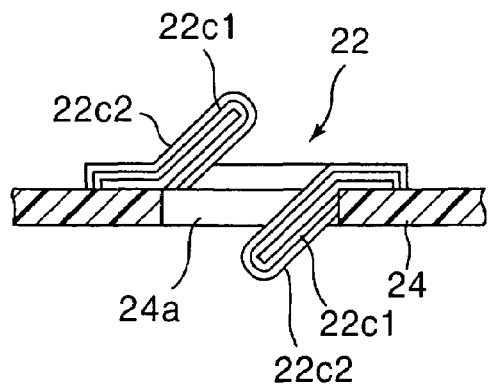
FIG. 8 is a cross-sectional view of a contact electrode provided with an uppermost layer.

In addition, as shown in FIG. 8, another thin film layer 22c2 may be formed as an uppermost layer on a surface of the thin film layer 22c1. The thin film layer 22c2 is provided so as to reduce an electrical resistance of the entire contact electrode and can be formed by plating. In a case of forming by plating, platinum metals such as gold (Au) and palladium (Pd) are preferred to be used.

Making a surface of an uppermost layer of the contact electrode rough to a certain degree, that is, providing an irregularity on the surface of the uppermost layer, facilitates an electrical contact. That is, when the LSI-circuit-side contact piece 22b1 and the test-board-side contact piece 22b2 are pressed against the corresponding terminal 6a and the corresponding electrode 8a, respectively, the irregularities on the surfaces of the uppermost layers break oxide films on the terminal 6a and the electrode 8a so as to facilitate electrical contacts. A method of fluctuating an electric current during plating can make the surface of the uppermost layer rough. For example, applying a voltage, fluctuating like a sine wave, as a plating voltage can alter plating conditions and, thus, provide an irregularity on a surface of a plating layer.

Additionally, when the contact electrode is placed in contact with a solder terminal, it is preferred that the uppermost layer of the contact electrode be formed of rhodium (Rh) to which a solder is not likely to adhere and that the uppermost layer be formed of palladium (Pd) or platinum (Pt) which is not likely to compose a solder alloy.

For example, a contact electrode 22 having a structure shown in FIG. 8, comprising a copper foil of 18 μm in thickness applied on the insulating substrate 24; a nickel (Ni) plating layer of 25 μm in thickness applied on a surface of the copper foil; and as an uppermost layer, a gold (Au) or palladium (Pd) plating layer of 1 to 3 μm in thickness, can be used for more than 10,000 contacts, in a high temperature of 125° C., with a contact pressure of 10 grams per pin. The above-mentioned contact electrode 22 can also be formed by forming a nickel (Ni) plating layer of approximately 12 μm in thickness before the bending process; forming another nickel (Ni) plating layer of approximately 12 μm in thickness after the bending process; and forming a gold (Au) or palladium (Pd) plating layer of 1 to 3 μm in thickness.

As explained above, predetermined mechanical and electric properties can be achieved by varying a number of plating layers, plating materials, a number of plating processes and a timing of plating processes.

Figure 9A:
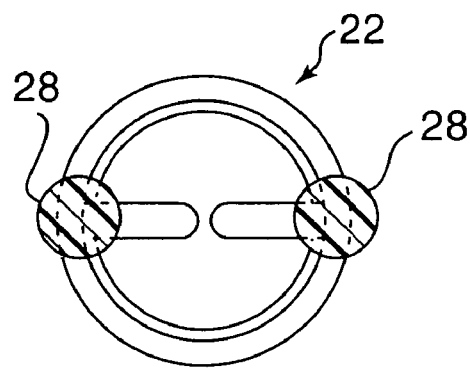
FIG. 9A is a plan view of a contact electrode provided with a reinforcing material.
Figure 9B:
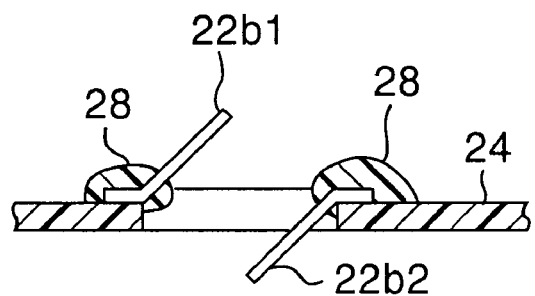
FIG. 9B is a cross-sectional view of the contact electrode provided with the reinforcing material.

In addition, after forming the above-mentioned contact electrode 22, a reinforcing material 28 may be provided at the root of each of the LSI-circuit-side contact piece 22b1 and the test-board-side contact piece 22b2, as shown in FIG. 9A and FIG. 9B. The reinforcing material 28 can be easily formed, for example, by applying an epoxy resin by potting and curing the epoxy resin. Forming the reinforcing material 28 at the root of each of the contact pieces prevents the contact piece from being damaged and provides a longer life duration for the contactor.

Figure 10:
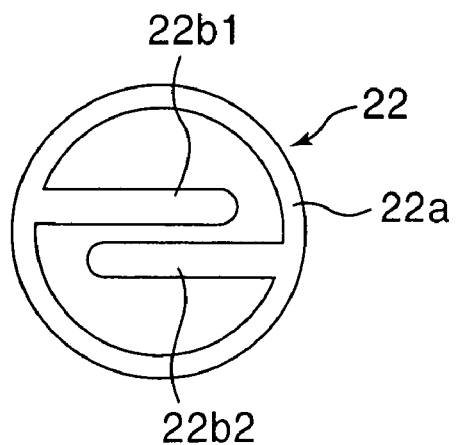
FIG. 10 is a plan view of a variation of the contact electrode shown in FIG. 3.

In the above-mentioned contact electrode 22, the LSI-circuit-side contact piece 22b1 and the test-board-side contact piece 22b2 extend in the same diametrical line. However, the contact pieces 22b1 and 22b2 may be staggered as shown in FIG. 10. In this case, the contact pieces 22b1 and 22b2 can be made longer so that the contact pieces 22b1 and 22b2 have wider ranges of elastic deformation.

Figure 11:
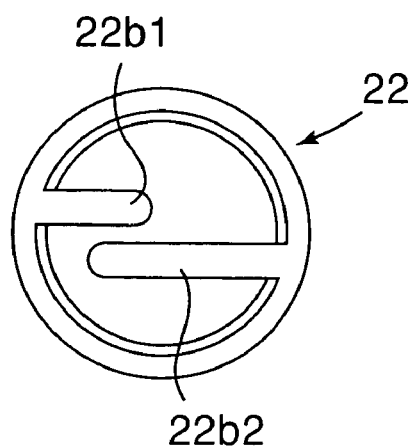
FIG. 11 is a plan view of another variation of the contact electrode shown in FIG. 3.

Likewise, lengths of the contact pieces 22b1 and 22b2 do not have to be the same. As shown in FIG. 11, the contact piece 22b2 may be longer than the contact piece 22b1. This is because the contact piece 22b2, as shown in FIG. 3, has to extend through the opening 24a of the insulating substrate 24 to the opposite side.

Figure 12:
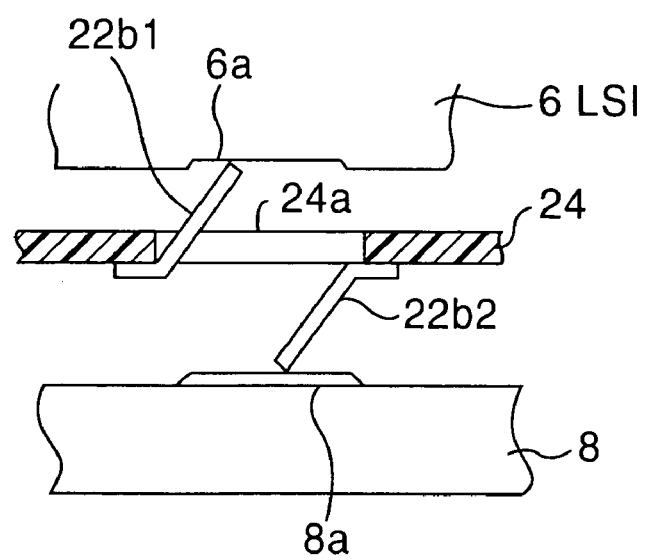
FIG. 12 is a cross-sectional view of a structure comprising a contact electrode formed on the side of a test board.

As mentioned above, lengths of the contact pieces can be arranged so as to realize a structure that provides necessary contacts. It should be noted that the contact electrode 22 can be formed on the insulating substrate 24 on the side of the test board 8, as shown in FIG. 12.

Additionally, selecting a material of the insulating substrate 24 so that coefficients of thermal expansion of the insulating substrate 24 and the LSI circuit 6 are substantially equal prevents the contact piece 22b1 from being detached from the terminal 6a of the LSI circuit 6 as a result of a temperature change. Also, selecting a material of the insulating substrate 24 so that coefficients of thermal expansion of the insulating substrate 24 and the test board 8 are substantially equal prevents the contact piece 22b2 from being detached from the electrode 8a of the test board 8 as a result of a temperature change. The insulating substrate 24 may be formed of an insulating tape substrate such as polyimide, a ceramics substrate, a glass substrate, or a silicon (Si) substrate having an insulating oxide film formed on a surface thereof. A ceramics substrate, a glass substrate, and silicon (Si) substrate are less flexible than an insulating tape substrate such as polyimide, but have an excellent flatness. Accordingly, elastic deformations of the LSI-circuit-side contact piece 22b1 and the test-board-side contact piece 22b2 can provide sure contacts with the LSI circuit 6 and the test board 8, respectively, by responding to varying heights thereto.

Next, a description will be given, with reference to FIG. 13, of the second embodiment according to the present invention.

Figure 13:
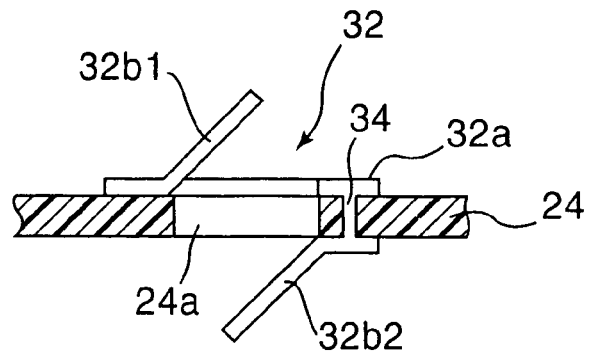
FIG. 13 is a cross-sectional view of a contact electrode formed on a contactor according to a second embodiment of the present invention.

FIG. 13 is a cross-sectional view of a contact electrode 32 of a contactor according to the second embodiment of the present invention. An entire structure of the contactor is the same as the above-mentioned contactor 20 according to the first embodiment, so a description thereof will be omitted.

The contact electrode 32 shown in FIG. 13 is formed after a copper plate or a copper foil is applied on both surfaces of the insulating substrate 24. The contact electrode 32, as the contact electrode 22, has an annular portion 32a and an LSI-circuit-side contact piece 32b1. The annular portion 32a and the LSI-circuit-side contact piece 32b1 are formed of a copper plate or a copper foil applied on one side (the LSI circuit 6's side) of the insulating substrate 24. Accordingly, the annular portion 32a and the LSI-circuit-side contact piece 32b1 are formed on the one side (the LSI circuit 6's side) of the insulating substrate 24.

However, unlike the above-mentioned contact electrode 22, a test-board-side contact piece 32b2 is formed of a copper plate or a copper foil applied on a side of the test board 8. Therefore, the test-board-side contact piece 32b2 extends to the side of the test board 8 without going through the opening 24a.

The test-board-side contact piece 32b2 is electrically connected via a via hole 34 to the annular portion located on the opposite side of the insulating substrate 24. Accordingly, the test-board-side contact piece 32b2 is electrically connected via the via hole 34 and the annular portion 32a to the LSI-circuit-side contact piece 32b1.

According to the contactor having the contact electrode 32 of the present embodiment, contact pieces having the same structure can be formed both on the side to the LSI circuit and on the side to the test board, by forming contact pieces 32b1 and 32b2 of the same length and bending the contact pieces 32b1 and 32b2 at the same angle.

Figure 14:
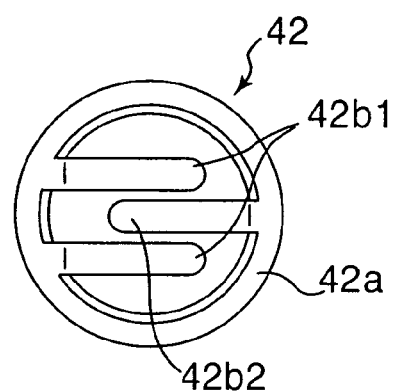
FIG. 14 is a plan view of a contact electrode formed on a contactor according to a third embodiment of the present invention.
Figure 15:
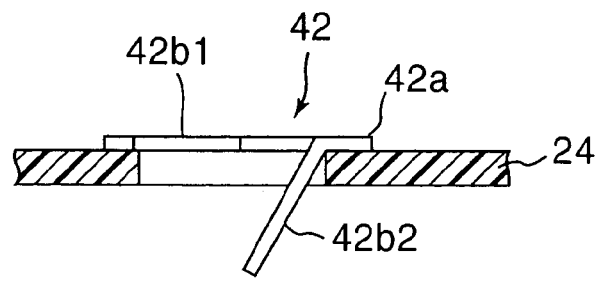
FIG. 15 is a cross-sectional view of the contact electrode shown in FIG. 14.

Next, a description will be given, with reference to FIG. 14 to FIG. 17, of the third embodiment according to the present invention. FIG. 14 is a plan view of a contact electrode 42 of a contactor according to the third embodiment of the present invention. FIG. 15 is a cross-sectional view of the contact electrode 42 shown in FIG. 14.

Figure 16:
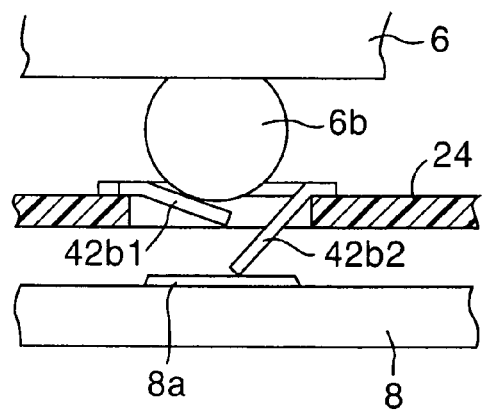
FIG. 16 is a cross-sectional view of the contact electrode shown in FIG. 14 being placed between an LSI circuit and a test board.

The contact electrode 42 with an annular portion 42a, shown in FIG. 14, according to the third embodiment of the present invention is a contact electrode adapted to a case where a terminal of the LSI circuit 6 is a protruding electrode 6b such as a solder bump (shown in FIG. 16). In order to prevent an LSI-circuit-side contact piece 42b1 from undergoing a permanent deformation due to a contact pressure with the solder bump 6b, the two LSI-circuit-side contact pieces 42b1 are juxtaposed on both sides of a central piece 42b2 and a centerline of the solder bump 6b, avoiding the center of the solder bump 6b. In FIG. 15, the LSI-circuit-side contact piece 42b1 is level, not bent toward the LSI circuit 6.

FIG. 16 is a cross-sectional view of the contact electrode 42 placed between the LSI circuit 6 and the test board 8. The LSI-circuit-side contact pieces 42b1, pressed by the solder bump 6b, are elastically deformed toward the test board 8, bent into the opening 24a. This elastic deformation provides a sure contact between the LSI-circuit-side contact pieces 42b1 and the solder bump 6b.

Figure 17:
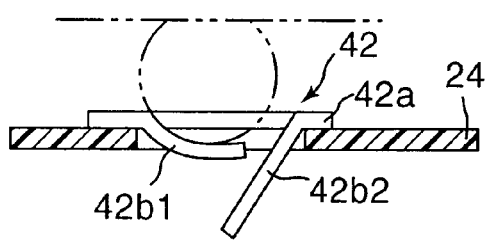
FIG. 17 is a cross-sectional view of a variation of the contact electrode shown in FIG. 14.

It should be noted that the LSI-circuit-side contact piece 42b1 does not necessarily have to be level, but may be bent a little toward the test board 8 beforehand so that the LSI-circuit-side contact pieces 42b1 deforms within a range of its elastic deformation. Also, as shown in FIG. 17, forming the LSI-circuit-side contact piece 42b1 curved along a shape of the solder bump 6b beforehand provides a surer contact between the LSI-circuit-side contact pieces 42b1 and the solder bump 6b.

Figure 18:
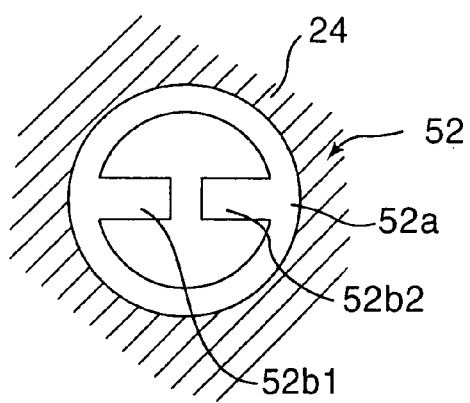
FIG. 18 is a plan view of a contact electrode formed on a contactor according to a fourth embodiment of the present invention.

Next, a description will be given, with reference to FIG. 18 to FIG. 21, of the fourth embodiment according to the present invention. FIG. 18 is a plan view of a contact electrode 52 of a contactor according to the fourth embodiment of the present invention.

As the contact electrode 22 according to the first embodiment of the present invention, the contact electrode 52 shown in FIG. 18 has an annular portion 52a, an LSI-circuit-side contact piece 52b1 and a test-board-side contact piece 52b2. However, the contact electrode 52 according to the present embodiment is formed as follows: forming an opening 24b having a shape corresponding to a shape of the contact electrode 52 in the insulating substrate 24 in advance; and forming a conductive film around a periphery of the opening 24b by such a method as plating or sputtering. That is, the contact electrode 52 itself is formed by such a method as plating or sputtering.

FIGS. 19A, 19B, and 19C illustrate steps of forming the contact electrode 52. First, as shown in FIG. 19A, the opening 24b having the shape corresponding to the shape of the contact electrode 52 is formed in the insulating substrate 24. Since the insulating substrate 24 is formed of such a resin sheet as a polyimide resin sheet, the opening 24b is easily formed by such a method as press working or etching. FIG. 20 is a plan view of the opening 24b formed in the insulating substrate 24.

Thereafter, a conductive film 54 is formed on all surfaces of the insulating substrate 24, as shown in FIG. 19B. The conductive film 54 is formed by sputtering such metals as chromium (Cr) or by electroless nickel (Ni) plating. Next, as shown in FIG. 19C, a part of the conductive film 54 is removed by such a method as etching so that a part to become the contact electrode 52 is left on the insulating substrate 24. Thereafter, as the contact electrode 22 according to the first embodiment, the LSI-circuit-side contact piece 52b1 and the test-board-side contact piece 52b2 are bent by using a bending template. This completes the contact electrode 52.

FIGS. 21A-C are other illustrations of steps of forming the contact electrode 52. First, in the steps shown in FIGS. 21A-21C, as in the steps shown in FIGS. 19A-19C, the opening 24b having the shape corresponding to the shape of the contact electrode 52 is formed in the insulating substrate 24, as shown in FIG. 21A. Next, as shown in FIG. 21B, a mask 56 is placed on the insulating substrate 24 so as to expose a shape of the contact electrode 52.

Then, the conductive film 54 is formed on the insulating substrate 24. Thereafter, as shown in FIG. 21C, the mask 56 along with a part of the conductive film 54 formed thereon is removed. Thereafter, as shown in FIG. 21D, the LSI-circuit-side contact piece 52b1 and the test-board-side contact piece 52b2 are bent by using a bending template.

In the contact electrode 52 of the contactor according to the present embodiment, the LSI-circuit-side contact piece 52b1 and the test-board-side contact piece 52b2 can have the same length.

Next, a description will be given, with reference to FIG. 22 to FIG. 24B, of the fifth embodiment according to the present invention.

The contactor according to the present embodiment comprises a contact electrode provided with a plating layer on its surface by electrolytic plating. FIG. 22 to FIG. 24B show the contact electrode 22 shown in FIG. 5 as an example of a contact electrode.

In the present embodiment, in forming a conductive film pattern for the contact electrode 22 not plated yet, an electric supply pattern 60 to be used in the plating process is formed in advance. That is, in a state of the contact electrode 22 not yet plated with the thin film layer 22c1 (the state shown in FIG. 6A, the electric supply pattern 60 for a later use in the plating process is formed, as shown in FIG. 22 to FIG. 24B.

The electric supply pattern 60 is connected to each of the contact electrodes 22 and is used for supplying a plating current to the contact electrode 22 in forming the thin film layer 22c1 by electrolytic plating. The electric supply pattern 60 can be formed at the same time as when the prototype of the contact electrode 22 is formed, by using a copper plate or a copper foil applied to the insulating substrate 24.

Figure 23:
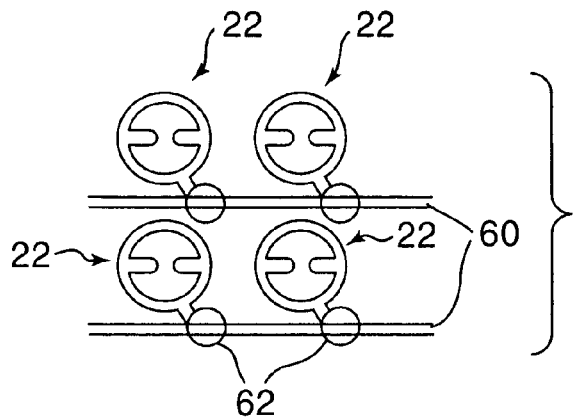
FIG. 23 is an illustration of a variation of the contactor shown in FIG. 22.
Figure 24A:
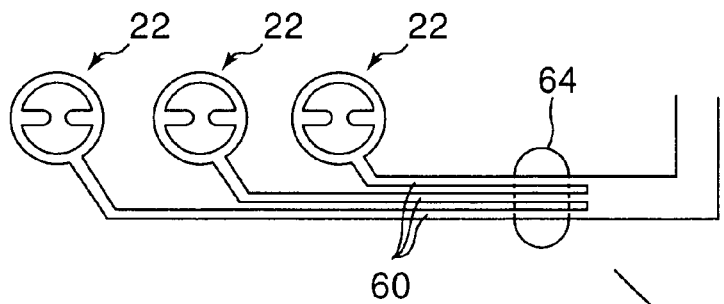
FIG. 24A is an illustration of another variation of the contactor shown in FIG. 22.
Figure 24B:
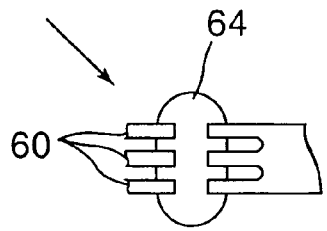
FIG. 24B is a detailed view of a portion of FIG. 24A.

After being used to supply a plating current in the plating process, the electric supply pattern 60 is severed at predetermined parts by such a method as laser cutting or punching. As shown in FIG. 23, by forming an opening 62 near the contact electrode 22 and arranging the electric supply pattern 60 to cross this opening 62, the electric supply pattern 60 can be easily severed by punching, using this opening 62. Also, as shown in FIGS. 24A-B, by bringing together a plurality of the electric supply patterns 60 at one part and forming an opening 64 at this part, a plurality of the electric supply patterns 60 can be easily severed by punching.

As mentioned above, according to a manufacturing method of the contactor of the present embodiment, a plating layer can be easily formed on a surface of the contact electrode and a manufacturing cost of the contactor can be reduced.

Figure 25:
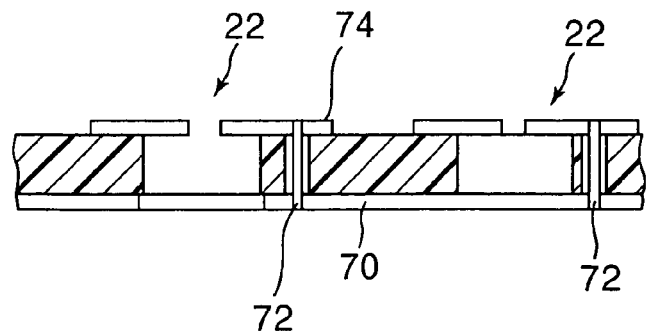
FIG. 25 is a cross-sectional view of a part of a contactor according to a sixth embodiment of the present invention.
Figure 26:
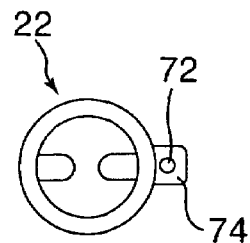
FIG. 26 is a plan view of the contact electrode shown in FIG. 25.

Next, a description will be given, with reference to FIG. 25 to FIG. 27, of the sixth embodiment according to the present invention.

The contactor according to the present embodiment, as the above-mentioned fifth embodiment, has an electric supply pattern 70 for the plating process. However, the electric supply pattern 70 is formed on a side opposite to the side where the contact electrode 22 is formed, as shown in FIG. 25.

That is, in the present embodiment, after a copper plate or a copper foil is applied on both surfaces of the insulating substrate 24, the contact electrode 22 is formed from the copper plate or the copper foil applied on one surface thereof, and, on the other hand, the electric supply pattern 70 is formed from the copper plate or the copper foil applied on the opposite surface. The contact electrode 22 and the electric supply pattern 70 are electrically connected by a via hole 72. The contact electrode 22 has a protruding piece 74 in which to form the via hole 72, as shown in FIG. 26.

Figure 27:
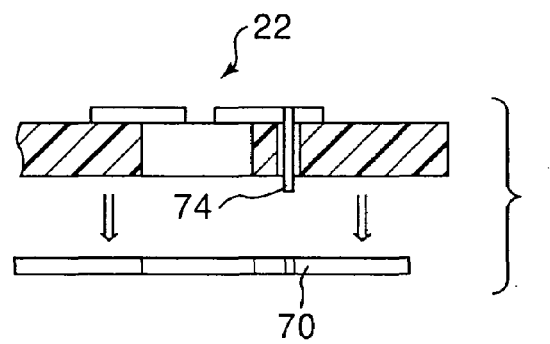
FIG. 27 is a cross-sectional view of the contact electrode shown in FIG. 25.

In the present embodiment, after completion of the plating process, the entire electric supply pattern 70 can be removed by etching, or, as shown in FIG. 27, can be removed at one time by a peeling method. Therefore, a used electric supply pattern 70 can be removed with ease.

Next, a description will be given, with reference to FIG. 28 to FIG. 30, of the seventh embodiment according to the present invention.

Figure 28:
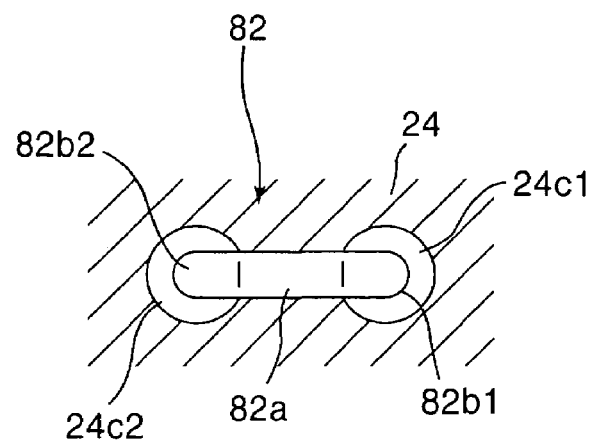
FIG. 28 is a plan view of a contact electrode formed on a contactor according to a seventh embodiment of the present invention.

FIG. 28 is a plan view of a contact electrode 82 formed on a contactor according to the seventh embodiment of the present invention. FIG. 29 is a side view of the contact electrode 82 shown in FIG. 28.

As shown in FIG. 28, the contact electrode 82 according to the present embodiment comprises an extending portion 82a, an LSI-circuit-side contact piece 82b1 and a test-board-side contact piece 82b2. In the above-mentioned contact electrode 22 according to the first embodiment, the LSI-circuit-side contact piece 22b1 and the test-board-side contact piece 22b2 are connected via the annular portion 22a. In the present embodiment, however, the LSI-circuit-side contact piece 82b1 and the test-board-side contact piece 82b2 are connected via the extending portion 82a. Although FIG. 28 shows the extending portion 82a in a straight line, the extending portion 82a may have an optional shape such as a bent shape or a curved shape.

On one end of the extending portion 82a is formed the LSI-circuit-side contact piece 82b1. Accordingly, the insulating substrate 24 has an opening 24c1 formed at a position corresponding to the one end of the extending portion 82a. By using this opening 24c1, the LSI-circuit-side contact piece 82b1 can be easily bent toward the LSI circuit 6.

On the other end of the extending portion 82a is formed the test-board-side contact piece 82b2. Accordingly, the insulating substrate 24 has an opening 24c2 formed at a position corresponding to the other end of the extending portion 82a. Through this opening 24c2, the test-board-side contact piece 82b2 can be bent toward the test board 8.

Figure 29:
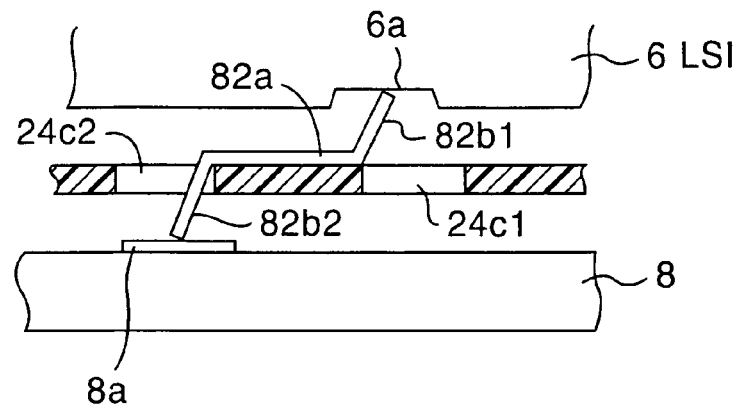
FIG. 29 is a side view of the contact electrode shown in FIG. 28.
Figure 30:
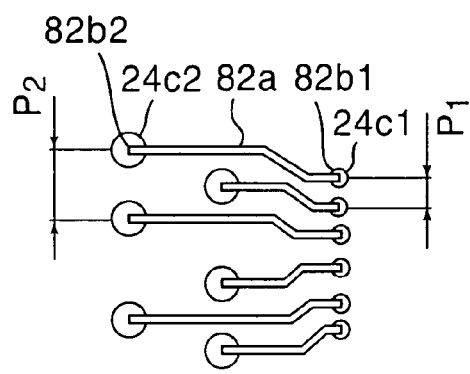
FIG. 30 is a plan view of an example of a shape of an extending portion of the contact electrode shown in FIG. 28.

FIG. 30 is a plan view of an example of a shape of the extending portion 82a. In FIG. 30, the extending portion 82a extends to the electrode 8a of the test board 8 (shown in FIG. 29) away from the LSI-circuit-side contact piece 82b1 so as to substantially extend a pitch P1 between the terminals 6a. That is, in a case of the pitch P1 being narrow, a pitch P2 between the electrodes 8a of the test board 8 can be extended. In addition, by extending the extending portion 82a in a predetermined direction, the electrode 8a of the test board 8 can be arranged at any location.

For example, in a case where the LSI circuit 6 has two rows of the terminals 6a arranged around at the periphery thereof, drawing the extending portions 82a around allows the electrodes 8a of the test board 8 to be arrayed like a matrix on an area corresponding to the entire LSI circuit 6. As described above, the contactor according to the present embodiment can provide a large degree of freedom in arranging the electrodes 8a of the test board 8.

Next, a description will be given, with reference to FIG. 31 to FIG. 36, of the eighth embodiment according to the present invention.

Figure 31:
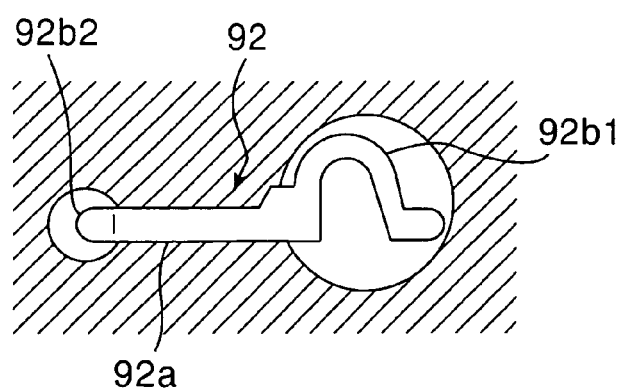
FIG. 31 is a plan view of a contact electrode before being bent, the contact electrode being formed on a contactor according to an eighth embodiment of the present invention.
Figure 32:
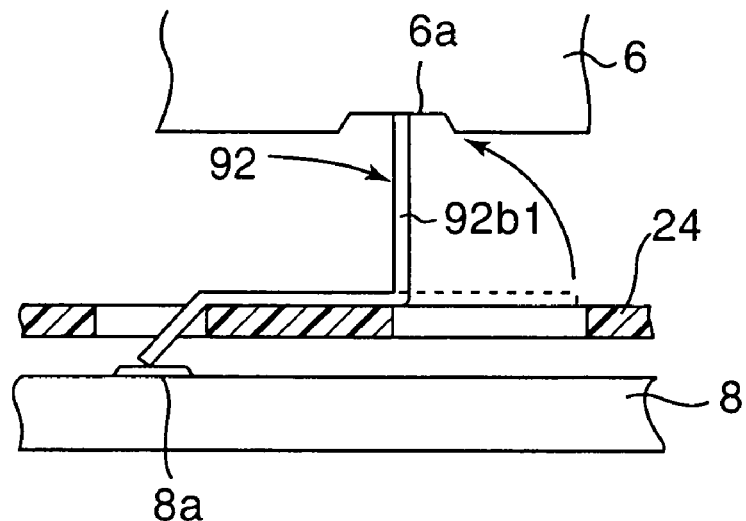
FIG. 32 is an elevational view of the contact electrode formed on the contactor according to the eighth embodiment of the present invention.
Figure 33:
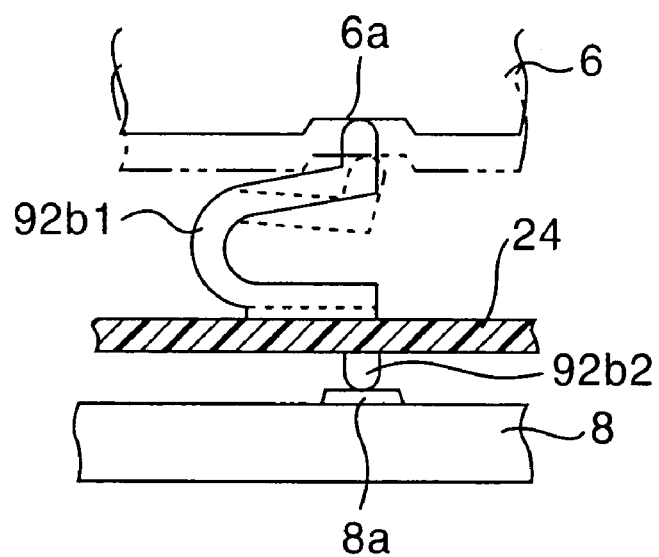
FIG. 33 is a side view of the contact electrode shown in FIG. 32.

FIG. 31 is a plan view of a contact electrode 92 before being bent, the contact electrode 92 being formed on a contactor according to the eighth embodiment of the present invention. FIG. 32 is an elevational view of the contact electrode 92. FIG. 33 is a side view of the contact electrode 92.

As with the above-mentioned contact electrode 82 according to the seventh embodiment, the contact electrode 92 according to the present embodiment comprises an extending portion 92a and a test-board-side contact piece 92b2 connected with one end of the extending portion 92a. However, an LSI-circuit-side contact piece 92b1 of the contact electrode 92 is formed into a bent or curved plane as seen in the plan view (FIG. 31). When used, the LSI-circuit-side contact piece 92b1 is bent at a right angle to the extending portion 92a as seen in the elevational view (FIG. 32).

The LSI-circuit-side contact piece 92b1 shown in FIG. 31 to FIG. 33 has a substantially U-shaped portion. Therefore, taking advantage of an elastic deformation of this portion, as shown by a double dashed chain line in FIG. 33, a contact electrode having a large elastic deformation can be easily formed.

Figure 34:
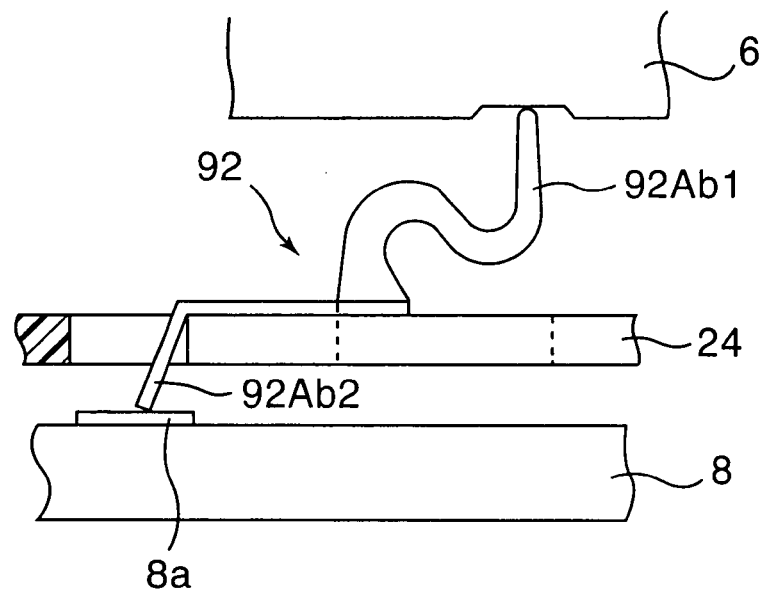
FIG. 34 is an elevational view of a variation of the contact electrode shown in FIG. 32.
Figure 35:
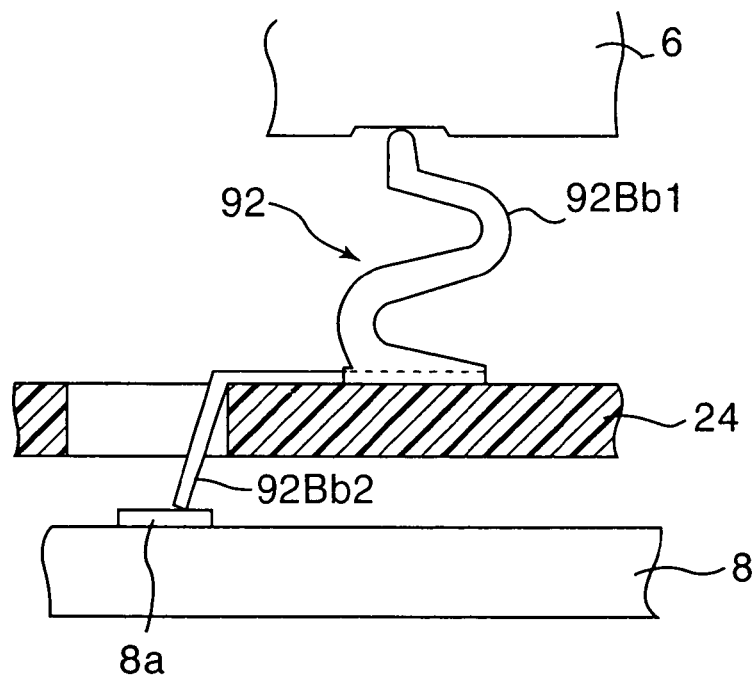
FIG. 35 is an elevational view of a variation of the contact electrode shown in FIG. 32.

FIG. 34 and FIG. 35 are elevational views of variations of the contact electrode 92 shown in FIG. 31 to FIG. 33. A contact electrode 92 shown in FIG. 34 comprises an LSI-circuit-side contact piece 92Ab1 having a substantially horizontal-S-shaped portion, which portion achieves a wide range of elastic deformation. The LSI-circuit-side contact piece 92Ab1 stands, being bent from a position vertical to a direction in which the extending portion 92a extends. A contact electrode 92 shown in FIG. 35 comprises an LSI-circuit-side contact piece 92Bb1 having a substantially vertical-S-shaped portion replacing the LSI-circuit-side contact piece 92Ab1 having a substantially horizontal-S-shaped portion in the contact electrode 92A shown in FIG. 34.

Forming the contact piece in a S-shape, as mentioned above, can make a displacement of a tip of the contact piece in a horizontal direction smaller than a displacement in a vertical direction, during elastic deformation. This prevents the tip of the contact piece from damaging the terminal of the LSI circuit when the contact piece is put into contact with the terminal of the LSI circuit.

Figure 36:
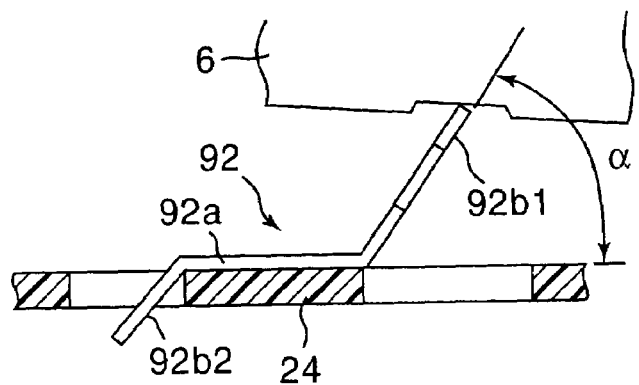
FIG. 36 is an illustration of an example of an LSI-circuit-side contact piece bent, not at a right angle, but at a predetermined angle smaller than 90 degrees from an extending portion.

FIG. 36 shows an example of the LSI-circuit-side contact piece 92b1 bent, not at a right angle, but at a predetermined angle $â_1$ smaller than 90 degrees to the extending portion 92a. This structure achieves an elastic deformation due to the curve of the contact piece and an elastic deformation due to the incline of the contact piece at the same time.

As mentioned above, because of a wide range of the elastic deformation of the contact piece, the contact electrode of the contactor according to the present embodiment can reduce a stress during elastic deformation of the contact piece. Therefore, a contact piece which endures repeated deformation a multiple number of times can be easily formed.

Also because of the wide range of the elastic deformation of the contact piece, when the terminals of the LSI circuit have various heights, the deformation of the contact piece can deal with such various heights. For example, in testing a wafer-level LSI circuit, the heights of the terminals of the LSI circuit vary by approximately 100 μm. The contact piece according to the present embodiment can easily adjust to the various heights.

In the present embodiment, the LSI-circuit-side contact piece is formed substantially U-shaped or substantially S-shaped. However, the LSI-circuit-side contact piece is not limited to these shapes, but other variations of curved shapes can be employed. Also, in the present embodiment, the LSI-circuit-side contact piece is formed into a curved shape. However, the test-board-side contact piece can also be formed into a curved shape. Further, in the present embodiment, as in the first embodiment, the thin film layer may be formed on the surface of the contact electrode by such a method as plating so as to improve mechanical and electric properties of the contact piece.

Figure 37:
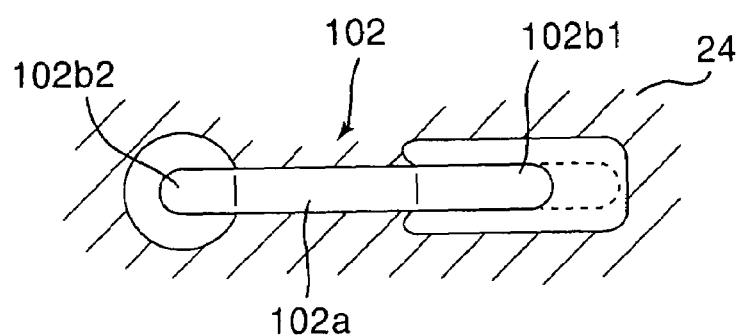
FIG. 37 is a plan view of a contact electrode formed on a contactor according to a ninth embodiment of the present invention.
Figure 38:
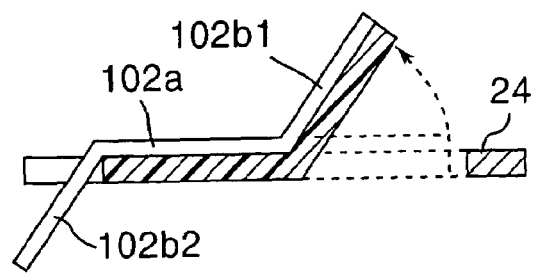
FIG. 38 is a side view of the contact electrode shown in FIG. 37.

Next, a description will be given, with reference to FIG. 37 and FIG. 38, of the ninth embodiment according to the present invention. FIG. 37 is a plan view of a contact electrode 102 formed on a contactor according to the ninth embodiment of the present invention. FIG. 38 is a side view of the contact electrode 102 shown in FIG. 37.

The contact electrode 102 has the same basic structure as the contact electrode 82 shown in FIG. 28 and FIG. 29 according to the seventh embodiment. However, an LSI-circuit-side contact piece 102b1 of the contact electrode 102 according to the present embodiment is bent together with the insulating substrate 24, as shown in FIG. 38. Although, in FIG. 37 and FIG. 38, the LSI-circuit-side contact piece 102b1 is bent together with the insulating substrate 24, a test-board-side contact piece 102b2 may be bent together with the insulating substrate 24 instead. Both the LSI-circuit-side contact piece 102b1 and the test-board-side contact piece 102b2 are bent from a middle piece 102a.

According to the present embodiment, elastic deformation of the contact piece of the contact electrode can be achieved by using elasticity of the insulating substrate.

Figure 39:
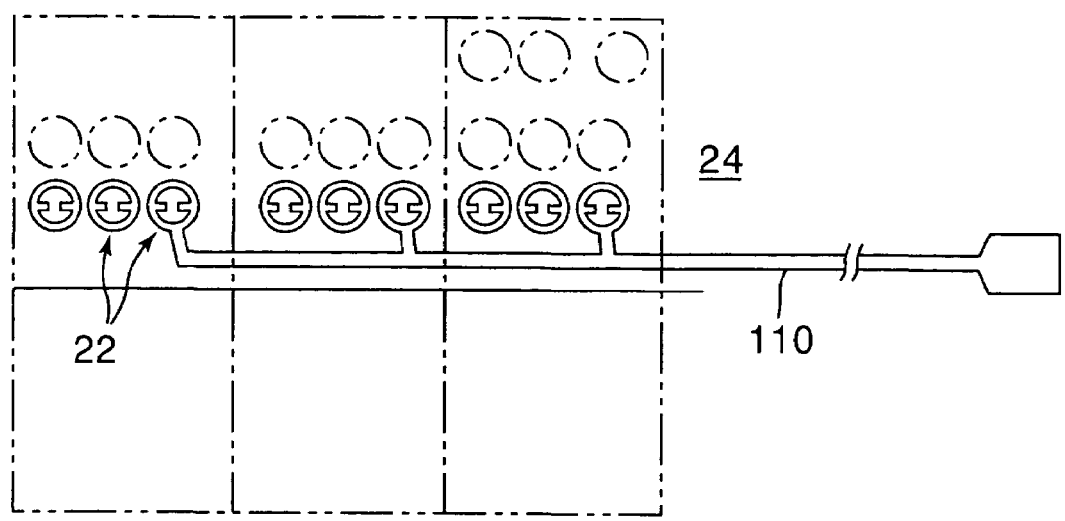
FIG. 39 is an illustration for explaining a contactor according to a tenth embodiment of the present invention.

Next, a description will be given, with reference to FIG. 39, of the tenth embodiment according to the present invention. In FIG. 39, the short/long dashed line indicates an area of the LSI circuit.

A contactor according to the present embodiment comprises the contact electrodes of the contactors according to the above-mentioned embodiments and a wiring pattern 110 formed on the insulating substrate 24. The wiring pattern 110 connects predetermined contact electrodes among the above-mentioned contact electrodes.

The wiring pattern 110 shown in FIG. 39 connects contact electrodes, each of the contact electrodes to be contacted with a particular terminal on each of wafer-level LSI circuits. Accordingly, by connecting the end of the wiring pattern 110 to an electric power source, a voltage can be applied via the contactor to the particular terminals on the wafer-level LSI circuits. Also, the particular terminals on the wafer-level LSI circuits can be grounded at one time via the contactor. Further, electrical conditions of the particular terminals on the wafer-level LSI circuits can be detected at one time via the contactor.

Next, a description will be given, with reference to FIG. 40 and FIG. 41, of the eleventh embodiment according to the present invention.

Figure 40:
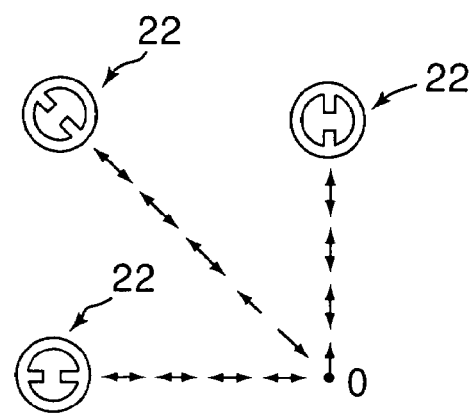
FIG. 40 is an illustration of an arrangement of a contact electrode formed on a contactor according to an eleventh embodiment of the present invention.

FIG. 40 is an illustration of an arrangement of a contact electrode formed on a contactor according to the eleventh embodiment of the present invention. FIG. 41 is an illustration for explaining effects of the arrangement of the contact electrode formed on the contactor according to the eleventh embodiment of the present invention.

The contactor according to the present embodiment uses the contact electrodes of the contactors according to the above-mentioned embodiments. However, each of the contact electrodes is arranged in a direction according to a predetermined rule. FIG. 40 and FIG. 41 show as an example the above-mentioned contact electrode 22 according to the first embodiment.

Specifically, as shown in FIG. 40, each of the contact electrodes 22 is arranged in a direction so that the contact pieces 22b1 and 22b2 are aligned radially from a center O of the contactor to the periphery thereof. This arrangement of the contact electrode deals with shifting of the terminal of the LSI circuit and the electrode of the test board caused by different coefficients of thermal expansion of the LSI circuit (wafer), the insulating substrate of the contactor and the test board.

That is, the different coefficients of thermal expansion of the LSI circuit (wafer), the insulating substrate of the contactor and the test board sometimes cause the terminal of the LSI circuit or the electrode of the test board to shift with respect to the corresponding contact piece of the contact electrode. Since the contact piece is pressed against the terminal or the electrode at a predetermined pressure, if the terminal or the electrode shifts in such a direction as to increase a bending angle of the contact piece, the tip of the contact piece may bite into the terminal or the electrode, so the contact piece and the terminal or the electrode may be deformed or damaged.

Figure 41:
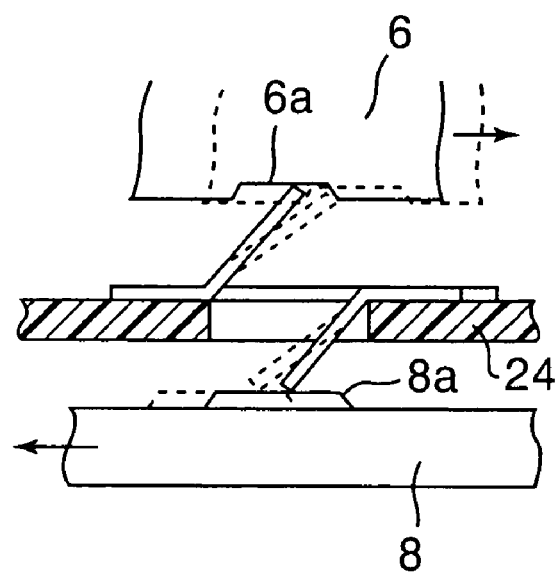
FIG. 41 is an illustration for explaining effects of the arrangement of the contact electrode shown in FIG. 40.

In the present embodiment, as shown in FIG. 41, each of the contact electrodes 22 is arranged so that, if the terminal of the LSI circuit or the electrode of the test board shifts with respect to the corresponding contact piece, the terminal or the electrode shifts in such a direction as to decrease the bending angle of the contact piece. This allows the tip of the contact piece to shift smoothly on the terminal or the electrode and prevents the contact piece from biting into the terminal or the electrode.

Also, according to the above-mentioned arrangement of the contact electrode, when the temperature rises, the contact piece of the contact electrode extends by thermal expansion in the same direction as the terminal of the LSI circuit or the electrode of the test board shifts by thermal expansion. This allows the tip of the contact piece to shift in the same direction as the terminal or the electrode shifts by thermal expansion, and thus prevents the tip of the contact piece from being detached from the terminal or the electrode.

Next, a description will be given, with reference to FIG. 42, of the twelfth embodiment according to the present invention.

Figure 42:
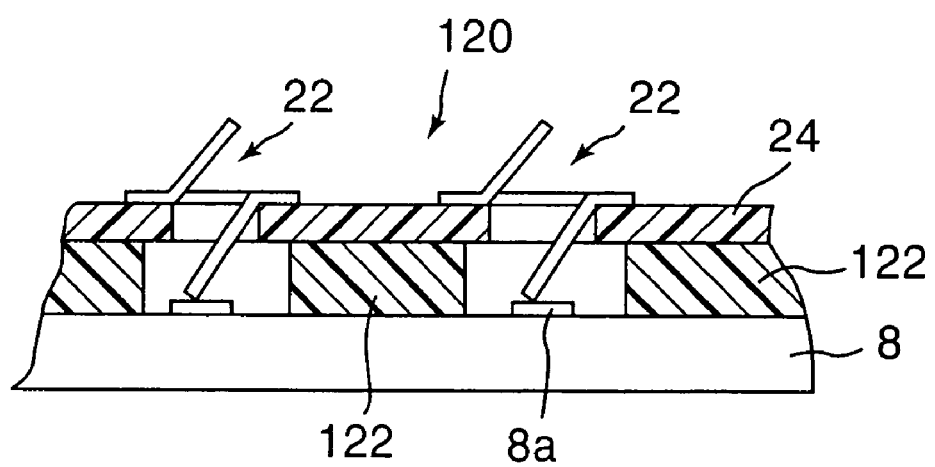
FIG. 42 is a cross-sectional view of a part of a contactor according to a twelfth embodiment of the present invention.

FIG. 42 is a cross-sectional view of a part of a contactor 120 according to the twelfth embodiment of the present invention. The contactor according to the present embodiment uses the contact electrodes according to the above-mentioned embodiments. FIG. 42 shows as an example the contact electrode 22 according to the first embodiment.

The contactor 120 according to the present embodiment comprises a spacer 122 on the side of the test board 8. The spacer 122 has a predetermined thickness so that, when the contactor 120 is pressed toward the test board 8, the distance between the contactor 120 and the test board 8 is maintained (at the thickness of the spacer 122). This prevents the contact piece of the contact electrode 22 from being excessively pressed and suffering a permanent deformation or damages, when an excessive pressure is imposed on the contactor 120.

The present invention is not limited to the specifically disclosed embodiments, and variations and modifications may be made without departing from the scope of the present invention.

The present application is based on Japanese priority application No.2000-080974 filed on Mar. 22, 2000, the entire contents of which are hereby incorporated by reference.

What is claimed is:

1. A method of manufacturing a contactor where the contactor is placed between a semiconductor device and a test board so as to electrically connect said semiconductor device to said test board, said method comprising the steps of:

forming a conductive layer on a first surface of an insulating substrate;

processing said conductive layer into a contact electrode comprising a first contact piece, a second contact piece, and a connecting portion which electrically connects said first contact piece and said second contact piece; and bending said first contact piece in a direction separating from said first surface of said insulating substrate at a predetermined angle and bending said second contact piece toward a second surface opposite to said first surface of said insulating substrate at a predetermined angle so that an end of said second contact piece protrudes from said second surface by passing through an opening formed in said insulating substrate.

2. The method as claimed in claim 1, wherein the step of forming the conductive layer includes the step of applying a film material composed of a conductive material on a surface of said insulating substrate; and the step of processing includes the step of removing parts of said conductive layer applied on said insulating substrate so as to form said first contact piece, said second contact piece and said connecting portion.

3. The method as claimed in claim 1, wherein the step of forming the conductive layer includes the step of depositing a conductive material on a surface of said insulating substrate so as to form said conductive layer; and the step of processing includes the step of removing parts of said conductive layer deposited on said insulating substrate so as to form said first contact piece, said second contact piece and said connecting portion.

4. The method as claimed in claim 1, further comprising the step of forming the opening in said insulating substrate at a position where at least said second contact piece is formed.

5. The method as claimed in claim 1, wherein at least one of said first contact piece and said second contact piece is one of a curved plane and a bent plane, and said method further comprising the step of bending said at least one of said first contact piece and said second contact piece, at a position where said connecting portion and said at least one of said first contact piece and said second contact piece meet, at a predetermined angle from said insulating substrate.

6. The method as claimed in claim 1, further comprising the step of forming at least one surface layer on a surface of said conductive layer so as to change properties of said contact electrode.

7. The method as claimed in claim 1, further comprising the step of forming a reinforcing material at a position where said connecting portion and each of said first contact piece and said second contact piece meet.

8. A method of manufacturing a contactor where the contactor is placed between a semiconductor device and a test board so as to electrically connect said semiconductor device to said test board, said method comprising the steps of:

processing parts of an insulating substrate into a first contact piece and a second contact piece;

forming a conductive layer on said first contact piece and said second contact piece and forming a part of said conductive layer into a connecting portion which electrically connects said first contact piece and said second contact piece; and bending said first contact piece in a direction separating from a first surface of said insulating substrate at a predetermined angle and bending said second contact piece toward a second surface opposite said first surface of said insulating substrate at a predetermined angle so that an end of said second contact piece protrudes from said second surface by passing through an opening formed in said insulating substrate.

9. The method as claimed in claim 8, wherein the step of processing includes the step of forming said opening in said insulating substrate so as to form at least said second contact piece.

* * * * *